US012757412B2

(12) United States Patent
Chuang et al.

(10) Patent No.: US 12,757,412 B2
(45) Date of Patent: Oct. 6, 2026

(54) SEMICONDUCTOR PACKAGE STRUCTURE HAVING A CHIP STACK

(71) Applicant: CHANGXIN MEMORY TECHNOLOGIES, INC., Hefei City (CN)

(72) Inventors: Ling-Yi Chuang, Hefei (CN); Kaimin Lv, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 423 days.

(21) Appl. No.: 18/451,871

(22) Filed: Aug. 18, 2023

(65) Prior Publication Data

US 2024/0057353 A1 Feb. 15, 2024

Related U.S. Application Data

(63) Continuation of application No. PCT/CN2022/113899, filed on Aug. 22, 2022.

(30) Foreign Application Priority Data

Aug. 10, 2022 (CN) ........................ 202210956949.3

(51) Int. Cl.
*H10B 80/00* (2026.01)
*H10W 70/65* (2026.01)
(Continued)

(52) U.S. Cl.
CPC ............ *H10B 80/00* (2023.02); *H10W 70/65* (2026.01); *H10W 90/00* (2026.01);
(Continued)

(58) Field of Classification Search
CPC .... H10B 80/00; H10B 80/312; H10B 80/327; H10W 70/65; H10W 90/00;
(Continued)

(56) References Cited

U.S. PATENT DOCUMENTS 9,653,443 B2 * 5/2017 Cheng .................... H10W 90/00
10,217,726 B1 * 2/2019 Nakano ............... H01L 25/0657
(Continued)

FOREIGN PATENT DOCUMENTS

CN 103545280 A 1/2014
CN 206727065 U 12/2017
(Continued)

OTHER PUBLICATIONS

International Search Report in the international application No. PCT/CN2022/113899, mailed on Dec. 27, 2022. 3 pages.

*Primary Examiner* — Wael M Fahmy
*Assistant Examiner* — Tiberiu Dan Onuta
(74) *Attorney, Agent, or Firm* — Syncoda LLC; Feng Ma

(57) ABSTRACT

Provided are semiconductor package structure and a method for manufacturing the same. The semiconductor package structure includes: a first base; a first semiconductor chip connected to the first base; a second semiconductor chip stack structure located on the first semiconductor chip, the second semiconductor chip stack structure including a plurality of second semiconductor chips stacked in sequence in a first direction, the second semiconductor chip stack structure being provided with a plurality of first leads on an outermost side of the second semiconductor chips in the first direction, in which the first direction is a direction parallel to a plane of the first base; and at least one second base, signal lines in the at least one second base being connected to the first leads, the at least one second base being connected to the first base in a direction perpendicular to the plane of the first base.

13 Claims, 12 Drawing Sheets

(51) Int. Cl.
*H10W 72/00* (2026.01)
*H10W 80/00* (2026.01)
*H10W 90/00* (2026.01)

(52) U.S. Cl.
CPC ....... *H10W 90/401* (2026.01); *H10W 90/701* (2026.01); *H10W 72/877* (2026.01); *H10W 80/312* (2026.01); *H10W 80/327* (2026.01); *H10W 90/724* (2026.01); *H10W 90/732* (2026.01); *H10W 90/733* (2026.01); *H10W 90/755* (2026.01); *H10W 90/792* (2026.01)

(58) Field of Classification Search
CPC ............. H10W 90/401; H10W 90/701; H10W 90/724; H10W 90/732; H10W 90/733; H10W 90/755; H10W 90/792; H10W 72/877; H01L 23/13; H01L 23/49816; H01L 23/5385; H01L 23/48; H01L 23/562; H01L 25/0655; H01L 25/18; H01L 25/0657; H01L 2225/0651; H01L 2225/06517; H01L 2225/06531; H01L 2225/06541
See application file for complete search history.

(56) References Cited

U.S. PATENT DOCUMENTS

| | | | | |
|---|---|---|---|---|
| 11,152,344 | B2 * | 10/2021 | Yu | H01L 25/18 |
| 11,183,484 | B2 | 11/2021 | Okutsu et al. | |
| 2003/0052176 | A1 | 3/2003 | Nozawa | |
| 2009/0294947 | A1 * | 12/2009 | Tain | H10W 90/00 257/713 |
| 2014/0015144 | A1 | 1/2014 | Kim | |
| 2018/0277516 | A1 * | 9/2018 | Kume | H10W 90/00 |
| 2020/0108387 | A1 | 4/2020 | Dong | |
| 2020/0144159 | A1 | 5/2020 | Chang | |
| 2021/0143129 | A1 * | 5/2021 | Okutsu | H10W 90/00 |
| 2022/0189916 | A1 | 6/2022 | Jung | |
| 2022/0406755 | A1 * | 12/2022 | Hong | H01L 25/0657 |

FOREIGN PATENT DOCUMENTS

| | | | |
|---|---|---|---|
| CN | 111244054 | A | 6/2020 |
| CN | 113056819 | A | 6/2021 |

* cited by examiner

SEMICONDUCTOR PACKAGE STRUCTURE HAVING A CHIP STACK

CROSS-REFERENCE TO RELATED APPLICATIONS

This application is a continuation application of International Application No. PCT/CN2022/113899, filed on Aug. 22, 2022, which claims priority to Chinese Patent Application No. 202210956949.3, filed on Aug. 10, 2022. The disclosures of International Application No. PCT/CN2022/113899 and Chinese Patent Application No. 202210956949.3 are hereby incorporated by reference in their entireties.

BACKGROUND

The high bandwidth memory (HBM) is a kind of high-performance DRAM based on 3D stack process. Compared with the traditional memory technology, the HBM has a higher bandwidth, a larger I/O number, a lower power consumption and a smaller size, and can be applied to high-performance computing, supercomputers, large data centers, artificial intelligence/deep learning, cloud computing and other fields.

The HBM technology is mainly developed based on the demand for processor computing scale. In the early days, people had low requirements for computer data processing, and the processor architecture model had a small number of layers, a small computing scale and a low computing power. Later, with the development of AI and other technologies, the requirements for processors became increasingly high, and the demand for computing power increased correspondingly with the deepening of the model, which leaded to a bandwidth bottleneck, i.e. an I/O problem. At the moment, it was solved by increasing the on-chip cache and optimizing the scheduling model to increase the data reuse rate. However, with the popularization of AI and other technologies in the later period, the number of users increased, an AI processing in the cloud requires multi-users, high throughput, a low latency and a high density deployment, a sharp increase in computing units made the I/O bottleneck more serious. At this moment, the emergence of an on-chip HBM made it possible for AI/deep learning to be completely performed on the chip. While the integration level was improved, the bandwidth was no longer limited to the interconnection number of chip pins, thus eliminating the bottleneck of bandwidth and computing power to a certain extent.

However, with the increase of the integration requirements of the HBM, the number of chip stacked layers is increasing, and there are more and more technical difficulties.

SUMMARY

The disclosure relates to a technical field of three-dimensional processes, in particular to a semiconductor package structure and a method for manufacturing the same.

In view of this, embodiments of the disclosure provide a semiconductor package structure and a method for manufacturing the same.

According to the first aspect of embodiments of the disclosure, there is provided a semiconductor package structure, which includes a first base, a first semiconductor chip, a second semiconductor chip stack structure and at least one second base.

The first semiconductor chip is connected to the first base.

The second semiconductor chip stack structure is located on the first semiconductor chip. The second semiconductor chip stack structure includes a plurality of second semiconductor chips stacked in sequence in a first direction. The second semiconductor chip stack structure is provided with a plurality of first leads on one of the second semiconductor chips located at an outermost of the second semiconductor chip stack structure in the first direction. Herein, the first direction is a direction parallel to a plane of the first base.

Signal lines in the at least one second base are connected to the first leads. The at least one second base is connected to the first base in a direction perpendicular to the plane of the first base.

According to the second aspect of embodiments of the disclosure, there is provided a method for manufacturing the semiconductor package structure according to any of the above embodiments, the method includes the following operations.

A second semiconductor chip stack structure is formed, in which the second semiconductor chip stack structure includes a plurality of second semiconductor chips stacked in sequence.

A first semiconductor chip is formed.

A surface of the second semiconductor chip stack structure perpendicular to a stack direction is connected to a surface of the first semiconductor chip.

At least one second base is provided, in which the at least one second base is located on a side of the second semiconductor chip stack structure formed with first leads in the stack direction, and signal lines in the at least one second base is connected to the first leads.

A first base is provided, the first semiconductor chip is connected to the first base, and the at least one second base is connected to the first base.

BRIEF DESCRIPTION OF THE DRAWINGS

In order to more clearly illustrate the technical solutions of the embodiments of the disclosure or that of the related art, the drawings used in the embodiments will be briefly introduced herein below. Apparently, the drawings in the following description are merely some embodiments of the embodiments of the disclosure. For those of ordinary skill in the art, other drawings can be obtained according to these drawings without making creative efforts.

DETAILED DESCRIPTION

Figure 1:
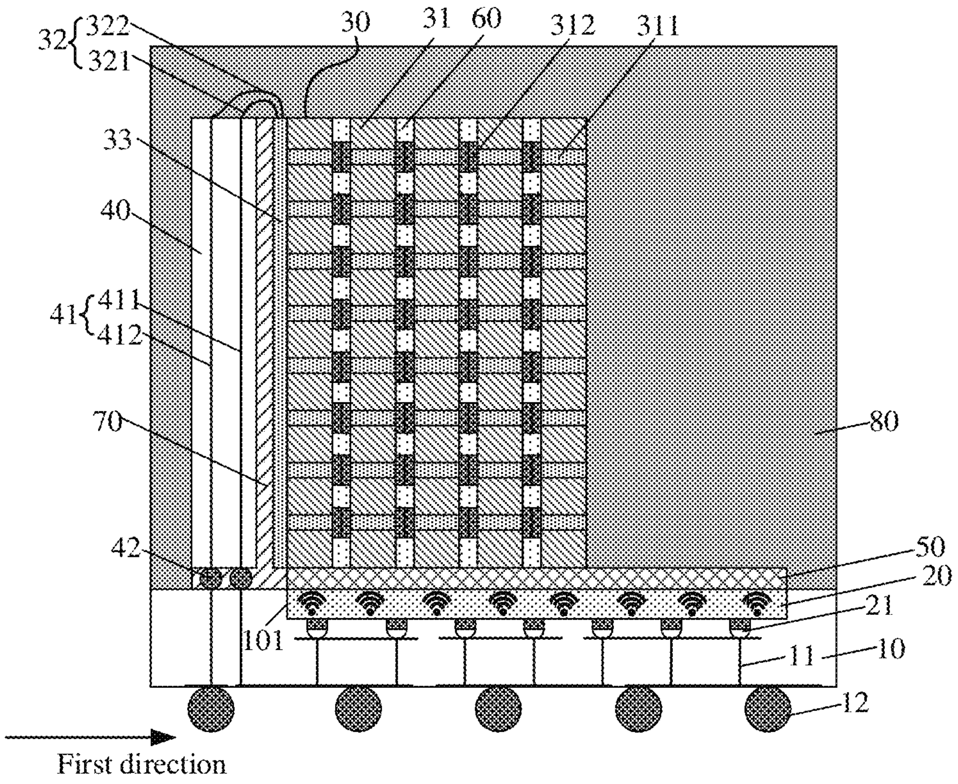
FIG. 1 is a schematic structural diagram of a semiconductor package structure provided by an embodiment of the disclosure.

Exemplary embodiments of the disclosure will be described in more detail below with reference to the accompanying drawings. Although the exemplary embodiments of the disclosure are shown in the drawings, it should be understood that the disclosure may be implemented in various forms and should not be limited by the specific embodiments set forth herein. In contrast, these embodiments are provided for the purpose that the disclosure will be more thoroughly understood and the scope of the disclosure will be fully conveyed to a person skilled in the art.

In the following description, numerous specific details are given for thorough understanding of the disclosure. However, it is apparent to a person skilled in the art that the disclosure may be implemented without one or more of these details. In other embodiments, some technical features well-known in the art are not described in order to avoid confusion with the disclosure; that is, not all of the features of actual embodiments are described herein, and well-known functions and constructions are not described in detail.

In the drawings, the dimensions of a layer, a region, an element and their relative dimensions may be exaggerated for clarity. The same reference numeral denotes the same element throughout the text.

It should be understood that when an element or a layer is referred to as "on", "adjacent to", "connected to" or "coupled to" another element or layer, it may be directly on the other element or layer, adjacent to the other element or layer, connected to or coupled to the other element or layer, or there may be an intermediate element or layer therebetween. In contrast, when the element is referred to as "directly on", "directly adjacent to", "directly connected to" or "directly coupled to" another element or layer, there is no intermediate element or layer therebetween. It should be understood that although terms "first", "second", "third" and the like may be used to describe various elements, components, regions, layers and/or portions, these elements, components, regions, layers and/or portions should not be limited by these terms. These terms are only used to distinguish one element, component, region, layer or portion from another element, component, region, layer or portion. Therefore, without departing from the teaching of the disclosure, a first element, component, region, layer or portion discussed below may be expressed as a second element, component, region, layer or portion. While discussing the second element, component, region, layer or portion, it does not mean that a first element, component, region, layer or portion is necessarily present in the disclosure.

Spatial relation terms, such as "under", "below", "lower", "underneath", "above", "upper" and the like, may be used here for convenience to describe a relationship between one element or feature and another elements or features shown in the drawings. It should be understood that, the spatial relation terms tend to further include different orientations of a device in use and operation in addition to orientations shown in the drawings. For example, if the device in the drawings is turned over, an element or feature described as being "below" or "underneath" or "under" another element may be oriented as being "on" the other element or feature. Therefore, the exemplary terms "below" and "under" may include up and down orientations. The device may also include additional orientations (e.g. rotation for 90 degrees or other orientations), and the spatial relation terms used here are interpreted accordingly.

The terms used here are intended to describe the specific embodiments only and are not to be a limitation to the disclosure. As used herein, the singular forms of "a/an", "one" and "said/the" are intended to include the plural forms as well, unless the context clearly dictates otherwise. It should be further understood that when terms "consist of" and/or "comprise/include" used in the specification mean that the stated features, integers, steps, operations, elements and/or components are present, but the presence or addition of one or more other features, integers, steps, operations, elements, components, and/or combinations is not excluded. As used herein, the term "and/or" includes any of the listed items and all combinations thereof.

In order to thoroughly understand the disclosure, detailed operations and detailed structures will be set forth in the following description in order to illustrate the technical solutions of the disclosure. Preferred embodiments of the disclosure are described in detail below; however, the disclosure may have other embodiments in addition to these detailed descriptions.

The HBM technology is a main representative product of a DRAM developed from traditional 2D to stereoscopic 3D, and opens the road to 3D development of the DRAM. Chips are stacked mainly by the through silicon via (TSV) technology to increase the throughput and overcome the limitation of the bandwidth in a single package, several DRAM dies are stacked vertically, and the dies are connected by the TVS technology. In view of technology, the HBM fully utilize the space and reduce the area, which is in line with the development trend of miniaturization and integration in the semiconductor industry, and breaks through the bottleneck of memory capacity and bandwidth, such that the HBM is regarded as a new generation DRAM solution.

In a package of 3D IC product, DRAM chips are generally stacked on a logic die in a parallel stack (P-stack) manner. With the increasing integration requirements, the number of stacked layers of the DRAM chips is increasing, and there are more and more technical difficulties. For example, the communication distance between DRAM chips stacked in a high layer and the logic die in the bottom layer becomes increasingly long, and the communication delay between DRAM chips of different layers and the logic chip may be different due to different distances; and TSVs for communication increases proportionally, which sacrifices the wafer area.

In view of this, embodiments of the disclosure provide a semiconductor package structure. FIG. 1 is a schematic structural diagram of a semiconductor package structure provided by an embodiment of the disclosure.

Referring to FIG. 1, the semiconductor package structure includes a first base 10, a first semiconductor chip 20, a second semiconductor chip stack structure 30 and a second base 40.

The first semiconductor chip 20 is connected to the first base 10.

The second semiconductor chip stack structure 30 is located on the first semiconductor chip 20. The second semiconductor chip stack structure 30 includes a plurality of second semiconductor chips 31 stacked in sequence in a first direction. The second semiconductor chip stack structure 30 is provided with a plurality of first leads 32 on one of the second semiconductor chips 31 located at an outermost of the second semiconductor chip stack structure in the first direction. Herein, the first direction is a direction parallel to a plane of the first base 10.

Signal lines 41 in the second base 40 is connected to the first leads 32, and the second base 40 is connected to the first base 10 in a direction perpendicular to the plane of the first base 10.

In the embodiments of the disclosure, the plurality of second semiconductor chips of the second semiconductor chip stack structure are arranged in parallel and vertically stacked (V-Stack) on the first semiconductor chip, so that the first semiconductor chip and the second semiconductor chips can communicate in a wireless manner, which can effectively reduce the difficulty in communication caused by the increase of the number of stacked layers of the second semiconductor chips when a plurality of second semiconductor chips are parallel stacked (P-Stack) in sequence on the first semiconductor chip. Moreover, the second semiconductor chip stack structure is connected to the second base via the first leads, and further connected to the first base. The first semiconductor chip is connected to the first base via the first conductive bumps, so that the first base supplies power for the first semiconductor chip and the second semiconductor chip stack structure in a wired manner, and performs signal exchange with the first semiconductor chip at the same time, which has a high reliability.

In an embodiment, the first base 10 may be a printed circuit board (PCB) or a re-distribution base.

The first base 10 may include a first substrate (not shown in the drawings) and a first upper insulating dielectric layer and a first lower insulating dielectric layer (which are not shown in the drawings) located on an upper surface and a lower surface of the first substrate, respectively.

The first substrate may be a silicon substrate, a germanium substrate, a silicon germanium substrate, a silicon carbide substrate, a silicon on insulator (SOI) substrate, a germanium on insulator (GOI) substrate or the like, may also be a substrate including other element semiconductor or compound semiconductor, for example, a glass substrate or a Group III-V compound substrate (e.g. a gallium nitride substrate, a gallium arsenide substrate or the like), and may further be a laminated structure, for example, a Si/SiGe structure or the like, and an epitaxial structure, for example, a silicon germanium on insulator (SGOI) structure or the like.

The first upper insulating dielectric layer and the first lower insulating dielectric layer may be solder masks. For example, the materials of the first upper insulating dielectric layer and the first lower insulating dielectric layer may be green paint.

Base connection bumps 12 are provided on a lower surface of the first base 10. The base connection bumps 12 can electrically connect the semiconductor package structure to an external device, and can receive at least one of a control signal, a power signal, and a ground signal for operating the first semiconductor chip and the second semiconductor chips from the external device, or can receive data signals to be stored in the first semiconductor chip and the second semiconductor chips from the external device, and can provide data in the first semiconductor chip and the second semiconductor chips to the external device.

The base connection bumps 12 include a conductive material. In the embodiments of the disclosure, the base connection bumps 12 are solder balls. It should be understood that, the shape of the base connection bumps provided in the embodiments of the disclosure is only a specific and feasible embodiment in the embodiments of the disclosure, and does not constitute a limitation to the disclosure, and the base connection bumps may also be a structure having another shape. The number, intervals and locations of base connection bumps are not limited to any particular arrangement and various modifications may be made.

In an embodiment, first conductive bumps 21 are provided on a face of the first semiconductor chip 20.

The material of the first conductive bumps 21 may include at least one of aluminum, copper, nickel, tungsten, platinum or gold.

The first semiconductor chip 20 and the first base 10 are electrically connected via the first conductive bumps 21. The first base 10 supplies power for, and performs signal exchange with the first semiconductor chip in a wired manner.

The first conductive bumps 21 are also connected to the base connection bumps 12 via leads 11 in the first base 10, so that the first semiconductor chip 20 can exchange information with an external device via the base connection bumps 12.

In an embodiment, as shown in FIG. 1, a groove 101 is provided in the first base 10, and the first semiconductor chip 20 is located in the groove 101. The first semiconductor chip 20 is connected to the first base 10 via the first conductive bumps 21, and the second base 40 is connected to the first base 10 via second conductive bumps 42.

In the embodiment, the first semiconductor chip is placed in the groove of the first base, which can reduce the package height of the semiconductor package structure.

Figure 2:
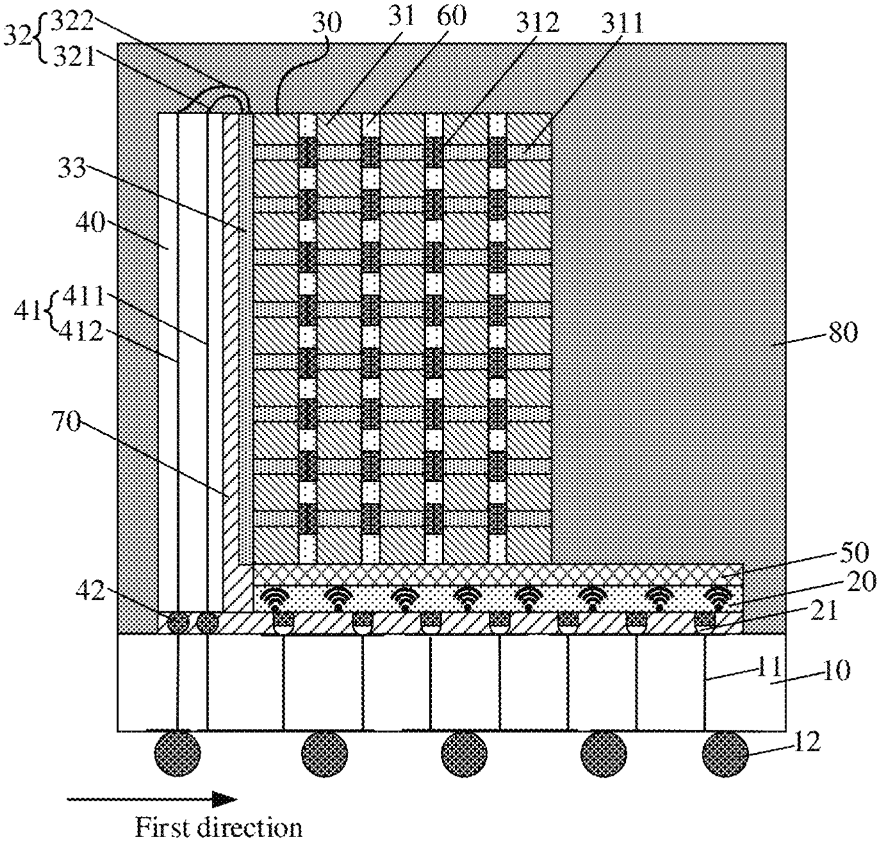
FIG. 2 is a schematic structural diagram of a semiconductor package structure provided by another embodiment of the disclosure.

In another embodiment, as shown in FIG. 2, the first semiconductor chip 20 is located on the first base 10, the first semiconductor chip 20 is connected to the first base 10 via the first conductive bumps 21, and the second base 40 is connected to the first base 10 via the second conductive bumps 42.

In the embodiment, the first semiconductor chip is located on the first base, so that the first base does not need to be provided with a groove, so the process is simpler, and there is a gap between the first semiconductor chip and the first base, which can increase the heat dissipation effect of the first semiconductor chip.

The stack number of the second semiconductor chips 31 of the second semiconductor chip stack structure 30 may be a plurality. In the embodiments of the disclosure, as shown in FIG. 1, the stack number of the second semiconductor chips 31 of the second semiconductor chip stack structure 30 is five.

In an embodiment, the first semiconductor chip 20 includes a logic chip, and the second semiconductor chip stack structure 30 includes a DRAM chip.

Figure 3:
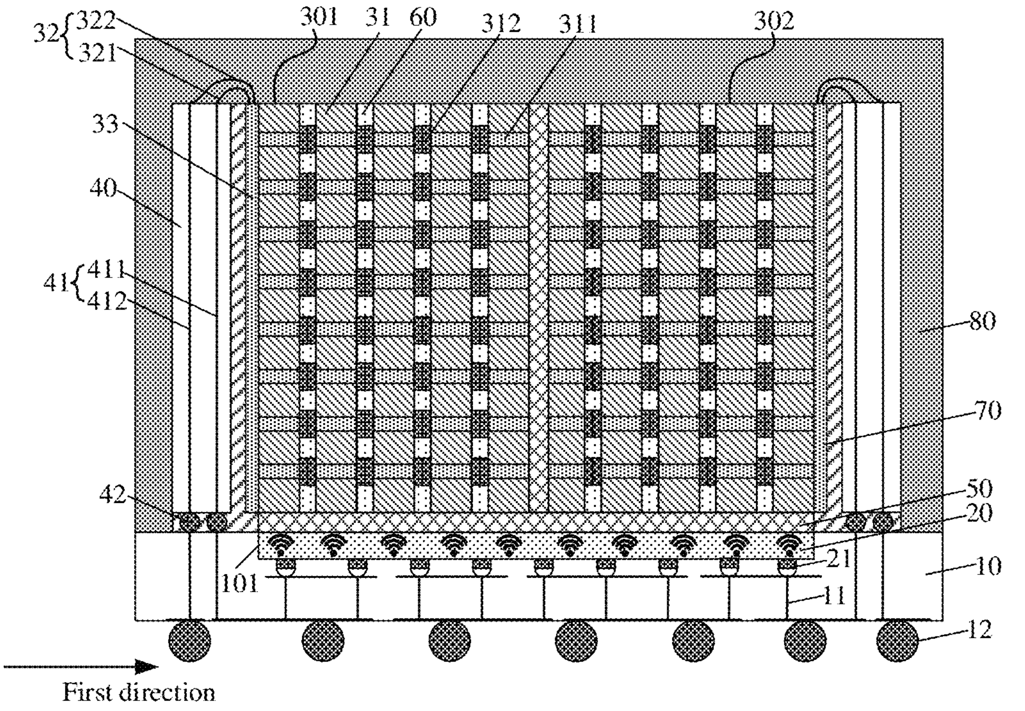
FIG. 3 is a schematic structural diagram of a semiconductor package structure provided by yet another embodiment of the disclosure.

In an embodiment, as shown in FIG. 3, the second semiconductor chip stack structure includes at least one first chip stack structure 301 and at least one second chip stack structure 302. The first chip stack structure 301 and the second chip stack structure 302 are arranged in parallel on the first semiconductor chip 20 in the first direction, and are arranged opposite to each other on a surface in the first direction away from the first leads 32.

The first chip stack structure 301 and the second chip stack structure 302 are respectively connected to one second base 40.

In the embodiment, the sides of the first chip stack structure and the second chip stack structure provided with the first leads are respectively powered via the second bases. Compared to powering a plurality of the second semiconductor chip stack structures from a single side, the voltage drop problem caused by a large number of stacked layers can be better solved, thereby improving the performance of the second semiconductor chip stack structure. In addition, the power supplies of the first chip stack structure and the second chip stack structure are ensured to be consistent, and the influence of the power voltage drop on the chips is reduced.

In an embodiment, the semiconductor package structure further includes an adhesive film 50. The adhesive film 50 is located between the first semiconductor chip 20 and the second semiconductor chip stack structure 30, and/or located between the first chip stack structure 301 and the second chip stack structure 302.

The adhesive film can bond the first semiconductor chip and the second semiconductor chip stack structure, and bond the first chip stack structure and the second chip stack structure, to enhance the adhesion between them, and further improve the firmness of the semiconductor package structure.

In an embodiment, the adhesive film 50 includes a die attaching film.

In an embodiment, when the adhesive film is located between the first semiconductor chip and the second semiconductor chip stack structure, the adhesive film includes a first adhesive film and a second adhesive film (not shown in the drawings) located on the first adhesive film, and the elastic modulus of the second adhesive film is greater than the elastic modulus of the first adhesive film.

In the embodiments of the disclosure, since the first adhesive film is connected to the first semiconductor chip and mainly plays a role of bonding. The second adhesive film is connected to the second semiconductor chip stack structure and mainly plays a role of preventing the chip from warping. Since the elastic modulus of the second adhesive film is greater, warping does not occur in the packaging process, and the first adhesive film has a lower elastic modulus, so it does not affect the bonding force between the first semiconductor chip and the second semiconductor chip stack structure in the subsequent process.

In an embodiment, the first semiconductor chip 20 and the second semiconductor chip stack structure 30 communicate by wireless. For example, a wireless coil (not shown in the drawings) is provided in each DRAM of the second semiconductor chip stack structure 30, correspondingly, a corresponding wireless coil is provided at a corresponding position of the first semiconductor chip 20.

Wireless communication between the first semiconductor chip and the second semiconductor chip stack structure can effectively solve the communication difficulties caused by the increase of the number of stacked layers of the second semiconductor chips. Moreover, the number of TSVs is reduced, and the process difficulty is reduced.

In an embodiment, the semiconductor package structure further includes a plurality of through silicon vias 311 and a plurality of third conductive bumps 312. Each of the plurality of the through silicon vias 311 penetrates through the second semiconductor chips 31 in the first direction; and each of the plurality of third conductive bumps 312 is located between two adjacent ones of the second semiconductor chips 31 and correspondingly connected to the through silicon vias 311. The second semiconductor chip stack structure 30 is formed by hybrid bonding.

The second semiconductor chip stack structure is obtained in a hybrid bonding manner, so that the stacked chip structure can be taken as a whole, thereby improving the mechanical strength in vertical placement of the stack structure while reducing the pressure on the chips.

The semiconductor package structure further includes a dielectric layer 60. The dielectric layer 60 is located between two adjacent ones of the second semiconductor chips 31. By arranging the dielectric layers, adjacent second semiconductor chips can be insulated and isolated, and the third conductive bumps are located in the dielectric layers, so that the possibility of coupling between adjacent third conductive bumps can be reduced.

The material of the dielectric layers 60 includes an oxide. In a specific embodiment, the material of the dielectric layers 60 includes $SiO_2$.

In addition, in order to increase the thickness of the second semiconductor chip stack structure and further enhance its mechanical strength, there is no need to thin the chips of the outermost layer during processing the through silicon vias.

In an embodiment, the semiconductor package structure further includes connectors 33. The connectors 33 are located on a surface of the one of the second semiconductor chips 31 located at the outermost of the second semiconductor chip stack structure 30 in the first direction, and connects the plurality of the through silicon vias 311 of the second semiconductor chip stack structure 30 to the first leads 32.

The material and structure of the second base 40 may be the same as those of the first base 10, so it will not be repeated here.

Figure 4:
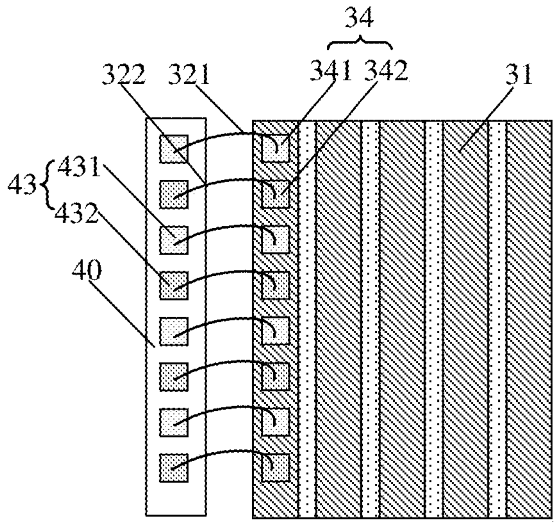
FIG. 4 is a top view of a semiconductor package structure provided by an embodiment of the disclosure.

FIG. 4 is a top view of a semiconductor package structure provided by an embodiment of the disclosure.

In an embodiment, as shown in FIG. 1 and FIG. 4, each of the signal lines 41 includes a ground line 411 and a power line 412, and each of the first leads 32 includes a first sub-lead 321 and a second sub-lead 322.

The ground line 411 is electrically connected to the first sub-lead 321, and the power line 412 is electrically connected to the second sub-lead 322.

In the embodiment, the ground signal of the second semiconductor chip stack structure 30 is led out to the ground lines 411 via the first sub-leads 321, and the power signal of the second semiconductor chip stack structure 30 is led out to the power lines 412 via the second sub-leads 322, and then the ground lines 411 and the power lines 412 are electrically connected to the first base 10 via the second conductive bumps 42, as a result, the first base 10 supplies power to the second semiconductor chip stack structure 30 via the second conductive bumps 42 and the ground lines 411 and the power lines 412.

As shown in FIG. 4, each first sub-lead 321 is arranged between two adjacent ones of the second sub-leads 322. Since the first sub-leads 321 are connected with the ground signal and the second sub-leads 322 are connected with the power signal, the crosstalk between different power signals can be reduced and shielding of the power can be enhanced.

Specifically, first pads 34 are provided on the second semiconductor chip stack structure 30, in which each of the first pad includes a first sub-pad 341 and a second sub-pad 342. Second pads 43 are provided on the second base 40, in which each of the second pad 43 includes a third sub-pad 431 and a fourth sub-pad 432. Herein, the first sub-pad 341 is connected to the third sub-pad 431 via the first sub-lead 321, and the second sub-pad 342 is connected to the fourth sub-pad 432 via the second sub-lead 322.

In an embodiment, the second conductive bumps 42 are connected to the base connection bumps 12 via the leads 11 in the first base 10, so that the second semiconductor chip stack structure 30 can exchange information with the external device via the base connection bumps 12.

In an embodiment, the semiconductor package structure further includes a package compound structure 80. The package compound structure is located on the first base 10. The package compound structure 80 wraps at least the second semiconductor chip stack structure 30 and the second base 40.

In the embodiment shown in FIG. 2, the package compound structure 80 also wraps the first semiconductor chip 20.

The package compound structure 80 includes a silicon-containing compound. The silicon-containing compound may be a spin on glass (SOG), a silicon-containing spin on dielectric (SOD), or other silicon-containing spin on materials.

By forming the package compound structure 80, and since the material of the package compound structure 80 includes a silicon-containing compound, the warping problem of the second semiconductor chip stack structure 30 can be reduced.

The semiconductor package structure further includes a filling layer 70. The filling layer is located between the second semiconductor chip stack structure 30 and the second base 40, and/or located between the first semiconductor chip 20 and the first base 10.

In some embodiments, the filling layer 70 may also be located between the second base 40 and the first base 10.

For example, in an embodiment, as shown in FIG. 1, when the first semiconductor chip 20 is located in the groove of the first base 10, the filling layer 70 may be located between the second semiconductor chip stack structure 30 and the second base 40, and/or located between the second base 40 and the first base 10.

In another embodiment, as shown in FIG. 2, when the first semiconductor chip 20 is located on the first base 10, the filling layer 70 may be located between the first semiconductor chip 20 and the first base 10, and/or located between the second base 40 and the first base 10, and/or located between the second semiconductor chip stack structure 30 and the second base 40.

For a three-dimensional stacked second semiconductor chip stack structure, since the thickness of the second semiconductor chip stack structure in the first direction is thin, the warping degree of the second semiconductor chip stack structure is high, when the second semiconductor chip stack structure is upright on the first semiconductor chip, it is difficult to weld the second semiconductor chip stack structure and the second base together because of the high warping degree. Therefore, providing a filling layer between the second semiconductor chip stack structure and the second base, and between the first base and the first semiconductor chip can effectively reduce the impact caused by the mismatch of the overall temperature expansion characteristics between the chips and the bases or caused by an external force, thereby increasing the reliability of the semiconductor package structure.

In an embodiment, the material of the filling layer 70 includes an epoxy resin.

The epoxy resin can be coated on the edges of chips by the principle of capillary action, so that it can penetrate to the bottoms of the chips or the bottoms of the bases, and then it is cured by heating. Because the epoxy resin can effectively improve the mechanical strength of solder joints, it is able to prolong the service life of the chips.

In an embodiment, the Young's modulus of the filling layer 70 is greater than the Young's modulus of the package compound structure 80.

Young's modulus is a physical quantity that can describe the ability of a solid material to resist deformation. The greater the Young's modulus, the greater the ability to resist deformation. When the Young's modulus is too less, the rigidity of the package structure is difficult to maintain, and it is prone to occur the problem of deformation, warping, damage or the like. Therefore, in the embodiments of the disclosure, the filling layer is formed, and the Young's modulus of the filling layer is greater than the Young's modulus of the package compound structure, such that the filling layer can have sufficient strength to support the whole package structure, and the package structure is not prone to occur the problem of deformation, warping, damage or the like.

Figure 5:
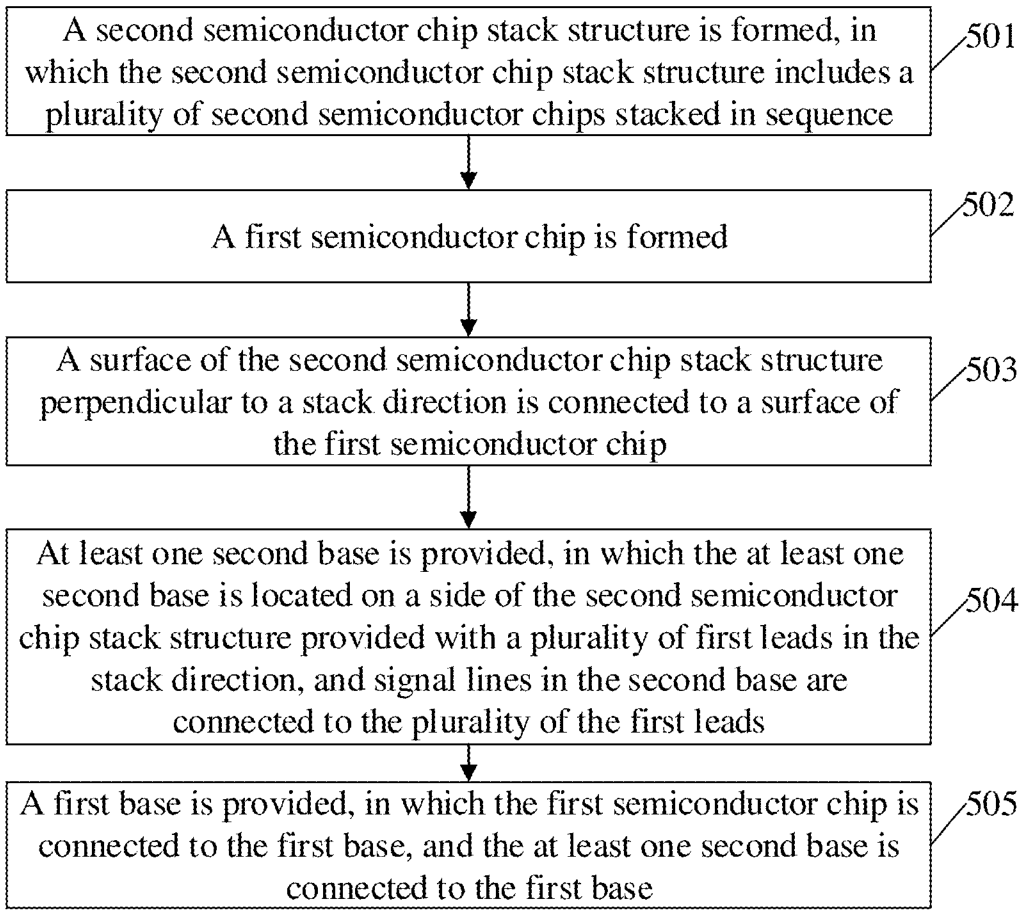
FIG. 5 is a flowchart showing a method for manufacturing a semiconductor package structure provided by an embodiment of the disclosure.

Embodiments of the disclosure further provide a method for manufacturing the semiconductor package structure as described in any of the above embodiments, referring to FIG. 5 for details, as shown in the figure, and the method includes the following operations.

At S501, a second semiconductor chip stack structure is formed. The second semiconductor chip stack structure includes a plurality of second semiconductor chips stacked in sequence.

At S502, a first semiconductor chip is formed.

At S503, a surface of the second semiconductor chip stack structure perpendicular to a stack direction is connected to a surface of the first semiconductor chip.

At S504, at least one second base is provided. The at least one second base is located on a side of the second semiconductor chip stack structure provided with a plurality of first leads in the stack direction, and signal lines in the second base connect to the first leads.

At S505, a first base is provided, the first semiconductor chip is connected to the first base, and the second base is connected to the first base.

The method for manufacturing a semiconductor package structure provided by the embodiments of the disclosure will be described in further detail below in combination with specific embodiments.

FIG. 6A to FIG. 6G are schematic structural diagrams of devices during a process for manufacturing a semiconductor package structure provided by an embodiment of the disclosure.

Figure 6A:
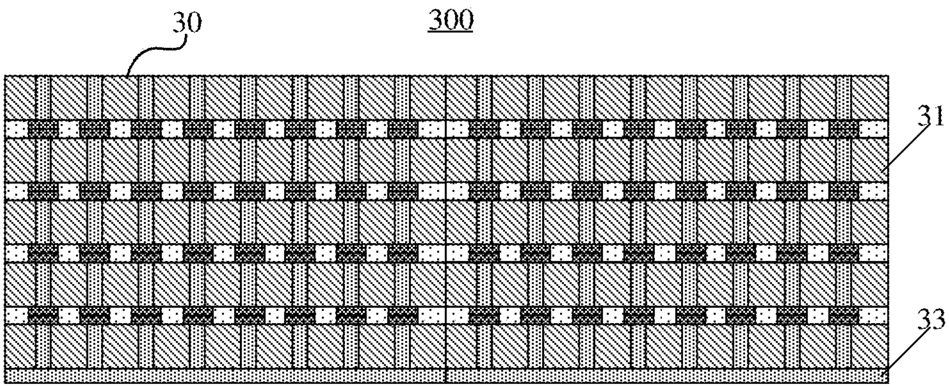
FIG. 6A to FIG. 6G are schematic structural diagrams of devices during a process for manufacturing a semiconductor package structure provided by an embodiment of the disclosure.
Figure 6B:
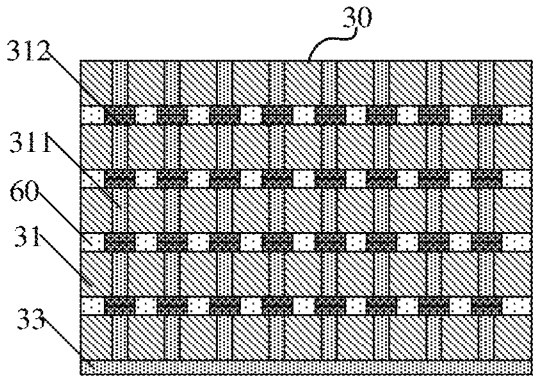

First, referring to FIG. 6A and FIG. 6B, S501 is performed, in which a second semiconductor chip stack structure 30 is formed. The second semiconductor chip stack structure 30 includes a plurality of second semiconductor chips 31 stacked in sequence.

Referring to FIG. 6A, forming the second semiconductor chip stack structure 30 includes the following operations. A plurality of second semiconductor chips 31 are connected by hybrid bonding to form a second semiconductor chip stack body 300.

The second semiconductor chip stack body 300 is cut to form a plurality of the second semiconductor chip stack structures 30.

In an embodiment, the second semiconductor chip stack structures 30 include DRAM chips.

The stack number of the second semiconductor chips 31 of the second semiconductor chip stack structure 30 may be a plurality. In the embodiment of the disclosure, as shown in FIG. 6B, the stack number of the second semiconductor chips 31 of the second semiconductor chip stack structure 30 is five.

Referring to FIG. 6B, the method for manufacturing a semiconductor package structure further includes the following operations. A plurality of through silicon vias 311 are formed, in which each of the plurality of the through silicon vias 311 penetrates through the second semiconductor chips 31 in the stack direction.

A plurality of third conductive bumps 312 are formed between two adjacent ones of the second semiconductor chips 31. The third conductive bumps 312 connect to the through silicon vias 311 in correspondence.

Two adjacent ones of the second semiconductor chips of the second semiconductor chip stack structure are connected by hybrid bonding through the silicon through vias and the third conductive bumps.

The method for manufacturing a semiconductor package structure further includes forming a dielectric layer 60 between two adjacent ones of the second semiconductor chips 31. By arranging the dielectric layer, the two adjacent one as of the second semiconductor chips can be insulated and isolated, and the third conductive bumps are located in the dielectric layer, which can reduce the possibility of coupling between adjacent third conductive bumps.

The material of the dielectric layer 60 includes an oxide. In a specific embodiment, the material of the dielectric layer 60 includes $SiO_2$.

In addition, in order to increase the thickness of the second semiconductor chip stack structure and thus enhance its mechanical strength, there is no need to thin the chips of the outermost layer.

In an embodiment, the method further includes the following operation. Connectors 33 are formed on the surface of the outermost side of the second semiconductor chips 31 of the second semiconductor chip stack structure 30 in the stack direction. The connectors 33 connects a plurality of through silicon vias 311 of the second semiconductor chip stack structure 30 to the first leads 32.

In some embodiments, as shown in FIG. 6B, the connectors 33 may be located on the lowest layer of the second semiconductor chips 31 of the second semiconductor chip stack structure 30. In other embodiments, the connectors 33 may be located on the uppermost layer of the second semiconductor chips 31 of the second semiconductor chip stack structure 30.

Figure 6C:
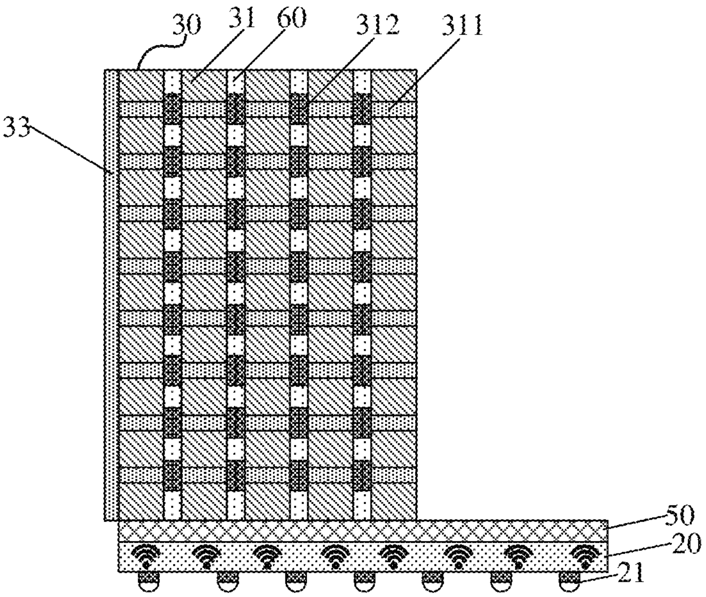

Next, referring to FIG. 6C, S502 and S503 are performed, in which the first semiconductor chip 20 is formed.

A surface of the second semiconductor chip stack structure 30 perpendicular to the stack direction is connected to a surface of the first semiconductor chip 20.

In some embodiments, when the stack direction is a direction perpendicular to the plane of the first semiconductor chip, the second semiconductor chip stack structure 30 is rotated 90 degrees and connected to the first semiconductor chip.

In other embodiments, when the stack direction is a direction parallel to the plane of the first semiconductor chip, there is no need to rotate the second semiconductor chip stack structure 30.

In an embodiment, the first semiconductor chip 20 includes a logic chip.

In an embodiment, the method further includes the following operation. First conductive bumps 21 are formed on the surface of one side of the first semiconductor chip 20. The second semiconductor chip stack structure 30 is connected to the surface of the first semiconductor chip 20 facing away from the first conductive bumps 21.

In an embodiment, the method further includes: forming an adhesive film 50. The second semiconductor chip stack structure 30 is connected with the first semiconductor chip 20 by the adhesive film 50.

The adhesive film 50 can bond the first semiconductor chip 20 and the second semiconductor chip stack structure 30 together to enhance the adhesion between them, thereby improving the firmness of the semiconductor package structure.

In an embodiment, the adhesive film 50 includes a die attaching film.

In an embodiment, when the adhesive film is located between the first semiconductor chip and the second semiconductor chip stack structure, the adhesive film includes a first adhesive film and a second adhesive film (which are not shown in the drawings) located on the first adhesive film, and the elastic modulus of the second adhesive film is greater than the elastic modulus of the first adhesive film.

In the embodiments of the disclosure, since the first adhesive film is connected to the first semiconductor chip and mainly plays a role of bonding, and the second adhesive film is connected to the second semiconductor chip stack structure and mainly plays a role of preventing the chips from warping. Since the elastic modulus of the second adhesive film is greater, warping does not occur in the packaging process, and the first adhesive film has the lower elastic modulus, it does not affect the bonding force between the first semiconductor chip and the second semiconductor chip stack structure in the subsequent process.

In an embodiment, the first semiconductor chip 20 and the second semiconductor chip stack structure 30 communicate by wireless. For example, a wireless coil (not shown in the drawings) is provided in each DRAM of the second semiconductor chip stack structure 30, correspondingly, a corresponding wireless coil is provided at a corresponding position of the first semiconductor chip 20.

Wireless communication between the first semiconductor chip and the second semiconductor chip stack structure can effectively solve the communication difficulties caused by the increase of the number of stacked layers of the second semiconductor chips.

Figure 6D:
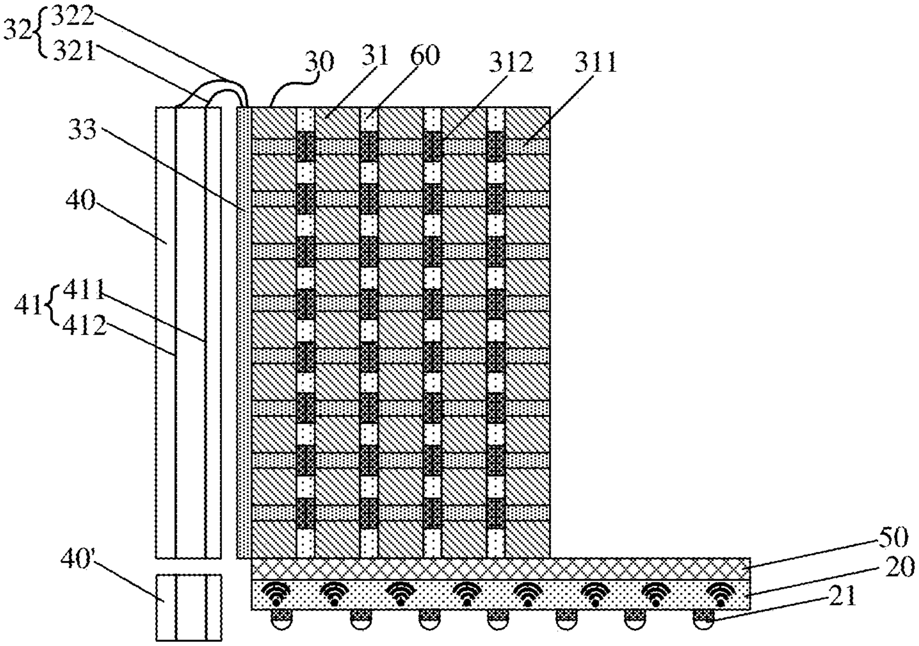
Figure 6E:
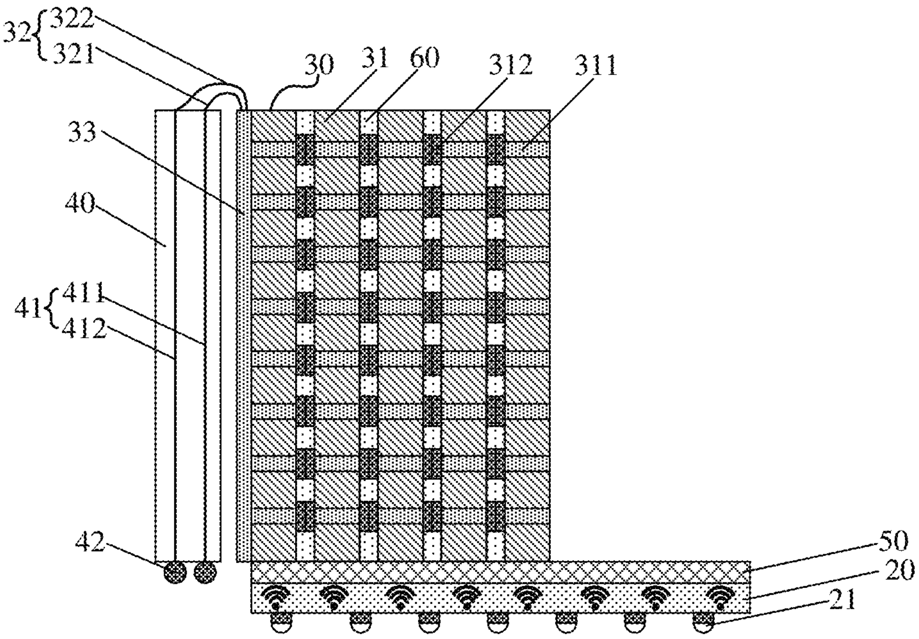

Next, referring to FIG. 6D and FIG. 6E, S504 is performed, in which a second base 40 is provided. The second base 40 is located on a side of the second semiconductor chip stack structure 30 provided with first leads 32 in the stack direction, and signal lines 41 in the second base 40 connect to the first leads 32.

Referring to FIG. 6D and FIG. 6E, providing the second base 40 includes the following operation.

The second base 40 is cut, and second conductive bumps 42 are formed on the second base, so that a surface of the second base 40 formed with the second conductive bumps 42 is flush with a surface of the second semiconductor chip stack structure 30 close to the first semiconductor chip 20, and the signal lines 41 are exposed.

Specifically, the second semiconductor chip stack structure 30 is first connected to the second base 40 via first leads 32, then the second base 40 is cut to a suitable size, for example, to be flush with a surface of the second semiconductor chip stack structure 30 close to the first semiconductor chip 20, and then the excess second base 40' is removed.

It should be noted that, in the embodiment shown in FIG. 6D, the surface of the second base 40 formed with the second conductive bumps 42 is flush with the surface of the second semiconductor chip stack structure 30 close to the first semiconductor chip 20; and in the embodiment in which the semiconductor package structure as shown in FIG. 2 is formed, the surface of the second base 40 formed with the second conductive bumps 42 is flush with the surface of the first semiconductor chip 20 formed with the first conductive bump 21.

Next, referring to FIG. 6E, second conductive bumps 42 are formed on the surface of the cut second base 40 that exposes the signal line 41, in which the second conductive bumps 42 are connected to the signal line 41.

In an embodiment, each of the signal lines 41 includes a ground line 411 and a power line 412, and each of the first leads 32 includes a first sub-lead 321 and a second sub-lead 322.

The ground line 411 is electrically connected to the first sub-lead 321, and the power line 412 is electrically connected to the second sub-lead 322.

In the embodiment, a ground signal of the second semiconductor chip stack structure 30 is led out to the ground lines 411 via the first sub-leads 321, and a power signal of the second semiconductor chip stack structure 30 is led out to the power lines 412 via the second sub-leads 322, and then the ground lines 411 and the power lines 412 are electrically connected to the first base 10 via the second conductive bumps 42, as a result, the first base 10 supplies power to the second semiconductor chip stack structure 30 via the second conductive bumps 42 and the ground lines 411 and the power lines 412.

As shown in FIG. 4, each first sub-lead 321 is arranged between two adjacent ones of the second sub-leads 322. Since the first sub-leads 321 are connected with the ground signal and the second sub-leads 322 are connected with the power signal, the crosstalk between different power signals can be reduced and shielding of the power can be enhanced.

Specifically, first pads 34 are formed on the second semiconductor chip stack structure 30, in which each of the first pad includes a first sub-pad 341 and a second sub-pad 342. Second pad 43 are formed on the second base 40, in which each of the second pads 43 includes a third sub-pad 431 and a fourth sub-pad 432. Herein, the first sub-pad 341 connects to the third sub-pad 431 via the first sub-lead 321, and the second sub-pad 342 connects to the fourth sub-pad 432 via the second sub-lead 322.

In an embodiment, as shown in FIG. 3, forming the second semiconductor chip stack structure 30 includes the following operation.

At least one first chip stack structure 301 and at least one second chip stack structure 302 are formed.

The method further includes the following operations.

After forming the first semiconductor chip 20, the first chip stack structure 301 and the second chip stack structure 302 are arranged in parallel on the first semiconductor chip 20 in the stack direction, and are arranged opposite to each other on a surface away from the first leads 32 in the first direction.

After providing the second base 40, the first chip stack structure 301 and the second chip stack structure 302 are connected to respectively one second base 40.

In the embodiment, the sides the first chip stack structure and the second chip stack structure provided with first leads are powered via the second bases, respectively. Compared to powering the plurality of the second semiconductor chip stack structures from a single side, the voltage drop problem caused by the large number of stacked layers can be better solved, thereby improving the performance of the second semiconductor chip stack structure. In addition, the power supplies of the first chip stack structure and the second chip stack structure are ensured to be consistent, and the influence of the power voltage drop on the chips is reduced.

In an embodiment, the first chip stack structure 301 and the second chip stack structure 302 are connected by the adhesive film 50.

Figure 6F:
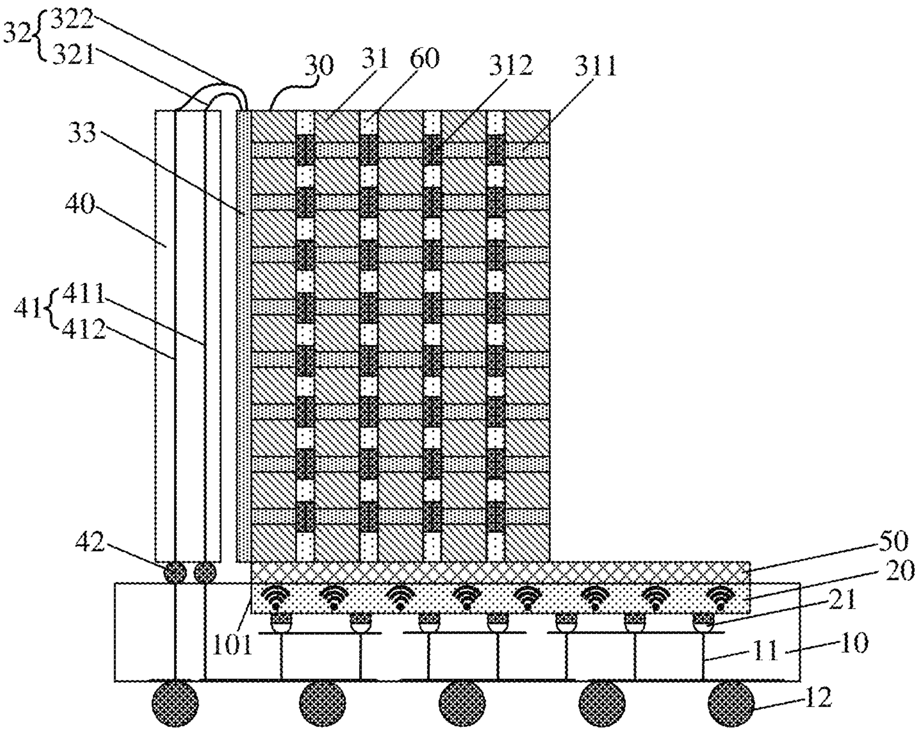

Next, referring to FIG. 6F, S505 is performed, in which a first base 10 is provided. The first semiconductor chip 20 is connected to the first base 10, and the second base 40 is connected to the first base 10.

In an embodiment, the first base 10 may be a printed circuit board (PCB) or a re-distribution base.

The first base 10 may include a first substrate (not shown in the drawings) and a first upper insulating dielectric layer and a first lower insulating dielectric layer (which are not shown in the drawings) located on an upper surface and a lower surface of the first substrate, respectively.

The first substrate may be a silicon substrate, a germanium substrate, a silicon germanium substrate, a silicon carbide substrate, a silicon on insulator (SOI) substrate, a germanium on insulator (GOI) substrate or the like; may also be a substrate including other element semiconductor or compound semiconductor, for example, a glass substrate or a Group III-V compound substrate (e.g. a gallium nitride substrate, a gallium arsenide substrate or the like), and may further be a laminated structure, for example, a Si/SiGe structure or the like; and an epitaxial structure, for example, a silicon germanium on insulator (SGOI) structure or the like.

The first upper insulating dielectric layer and the first lower insulating dielectric layer may be solder masks. For example, the materials of the first upper insulating dielectric layer and the first lower insulating dielectric layer may be a green paint.

Base connection bumps 12 are formed on a lower surface of the first base 10. The base connection bumps 12 may electrically connect the semiconductor package structure to an external device, may receive at least one of a control signal, a power signal, and a ground signal for operating the first semiconductor chip and the second semiconductor chip from the external device, or may receive a data signal to be stored in the first semiconductor chip and the second semiconductor chip from the external device, and may provide data in the first semiconductor chip and the second semiconductor chip to the external device.

The base connection bumps 12 include a conductive material. In the embodiments of the disclosure, the base connection bumps 12 are solder balls. It should be understood that, the shape of the base connection bump provided in the embodiments of the disclosure is only a specific and feasible embodiment in the embodiments of the disclosure, and does not constitute a limitation to the disclosure, and the base connection bumps may also be a structure having another shape. The number, intervals and locations of base connection bumps are not limited to any particular arrangement and various modifications may be made.

In an embodiment, specifically, the first semiconductor chip 20 is connected to the first base 10 via the first conductive bumps 21, and the second base 40 is connected to the first base 10 via the second conductive bumps 42.

In an embodiment, as shown in FIG. 6F, a groove 101 is formed in the first base 10. The first semiconductor chip 20 is placed in the groove 101.

In the embodiment, the first semiconductor chip is placed in the groove of the first base, which can reduce the package height of the semiconductor package structure.

In other embodiments, as shown in FIG. 2, the first semiconductor chip 20 is located on the first base 10, and the first conductive bumps 21 are located between the first semiconductor chip 20 and the first base 10.

In the embodiment, the first semiconductor chip is located on the first base, so that the first base does not need to be provided with a groove, so the process is simpler, and there is a gap between the first semiconductor chip and the first base, which can increase the heat dissipation effect of the first semiconductor chip.

The first semiconductor chip 20 and the first base 10 are electrically connected via the first conductive bumps 21. The first base 10 supplies power to and performs signal exchange with the first semiconductor chip in a wired manner.

The first conductive bumps 21 are also connected to the base connection bumps 12 via the leads 11 in the first base 10, so that the first semiconductor chip 20 can exchange information with an external device via the base connection bumps 12.

The second conductive bumps 42 are also connected to the base connection bumps 12 via the leads 11 in the first base 10, so that the second semiconductor chip stack structure 30 can exchange information with an external device via the base connection bump 12.

Figure 6G:
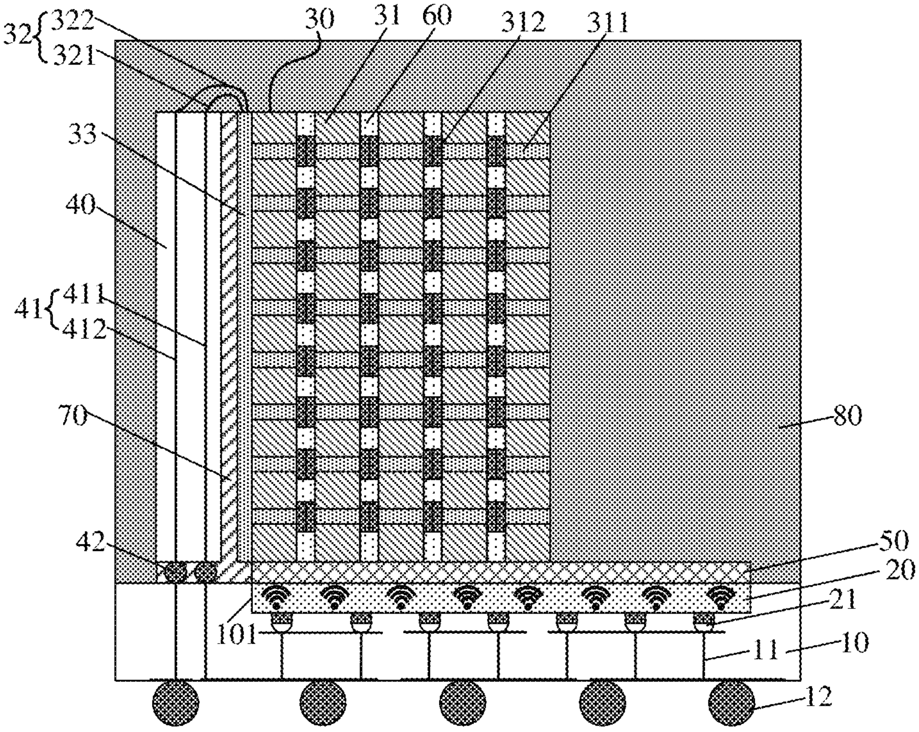

Next, referring to FIG. 6G, the method further includes forming a package compound structure 80 on the first base 10, in which the package compound structure 80 wraps at least the second semiconductor chip stack structure 30 and the second base 40.

In the embodiment shown in FIG. 2, the package compound structure 80 also wraps the first semiconductor chip 20.

The package compound structure 80 includes a silicon-containing compound. The silicon-containing compound may be a spin on glass (SOG), a silicon-containing spin on dielectric (SOD), or other silicon-containing spin on materials.

By forming the package compound structure 80, and since the material of the package compound structure 80 includes the silicon-containing compound, the warping problem of the second semiconductor chip stack structure 30 can be reduced.

Next, the method further includes forming a filling layer 70 between the second semiconductor chip stack structure 30 and the second base 40, and/or between the first semiconductor chip 20 and the first base 10.

In some embodiments, the filling layer 70 may also be located between the second base 40 and the first base 10.

For example, in an embodiment, as shown in FIG. 6G, when the first semiconductor chip 20 is located in the groove of the first base 10, the filling layer 70 may be located between the second semiconductor chip stack structure 30 and the second base 40, and/or located between the second base 40 and the first base 10.

In another embodiment, as shown in FIG. 2, when the first semiconductor chip 20 is located on the first base 10, the filling layer 70 may be located between the first semiconductor chip 20 and the first base 10, and/or located between the second base 40 and the first base 10, and/or between the second semiconductor chip stack structure 30 and the second base 40.

For the three-dimensional stacked second semiconductor chip stack structure, since the thickness of the second semiconductor chip stack structure in the first direction is thin, the warping degree of the second semiconductor chip stack structure is high, and when the second semiconductor chip stack structure is upright on the first semiconductor chip, it is difficult to weld the second semiconductor chip stack structure and the second base together because of the high warping degree. Therefore, providing the filling layer between the second semiconductor chip stack structure and the second base and between the first base and the first semiconductor chip, can effectively reduce the impact caused by the mismatch of the overall temperature expansion characteristics between the chips and the bases or caused by an external force, thereby increasing the reliability of the semiconductor package structure.

In an embodiment, the material of the filling layer 70 includes an epoxy resin.

The epoxy resin can be coated on the edges of the chips by the principle of capillary action, so that it can penetrate to the bottoms of the chips or the bottoms of the bases, and then it is cured by heating. Because the epoxy resin can effectively improve the mechanical strength of solder joints, it is able to prolong the service life of the chips.

In an embodiment, the Young's modulus of the filling layer 70 is greater than the Young's modulus of the package compound structure 80.

Young's modulus is a physical quantity that can describe the ability of a solid material to resist deformation. The greater the Young's modulus, the greater the ability to resist deformation. When the Young's modulus is too less, the rigidity of the package structure is difficult to maintain, and it is prone to occur the problem of deformation, warping, damage or the like. Therefore, in the embodiments of the disclosure, the filling layer is formed, and the Young's modulus of the filling layer is greater than the Young's modulus of the package compound structure, such that the filling layer can have sufficient strength to support the whole package structure, and the package structure is not prone to deform, warp, to be damaged or the like.

The above describes only preferred embodiments of the disclosure, and is not intended to limit the protection scope of the disclosure. Any modification, equivalent replacement and improvement made within the spirit and principles of the disclosure shall be included in the protection scope of the disclosure.

INDUSTRIAL PRACTICABILITY

In embodiments of the disclosure, the plurality of second semiconductor chips of second semiconductor chip stack structure are arranged in parallel and vertically stacked (V-Stack) on the first semiconductor chip, so that the first semiconductor chip and the second semiconductor chips can communicate in a wireless manner, which can effectively reduce the difficulty in communication caused by the increase of the number of stacked layers of the second semiconductor chips when a plurality of second semiconductor chips are parallel stacked (P-Stack) in sequence on the first semiconductor chip. Moreover, the second semiconductor chip stack structure connects to the second base via the first leads, and further connected to the first base. The first semiconductor chip connects to the first base via the first conductive bumps, so that the first base supplies power to the first semiconductor chip and the second semiconductor chip stack structure in a wired manner, and performs signal exchange with the first semiconductor chip at the same time, which has a high reliability.

The invention claimed is:

1. A semiconductor package structure comprising:
- a first base;
- a first semiconductor chip connected to the first base;
- a second semiconductor chip stack structure located on the first semiconductor chip, the second semiconductor chip stack structure comprising a plurality of second semiconductor chips stacked in sequence in a first direction, the second semiconductor chip stack structure being provided with a plurality of first leads on one of the second semiconductor chips located at outermost of the second semiconductor chip stack structure in the first direction, wherein the first direction is a direction parallel to a plane of the first base; and
- at least one second base, signal lines in the at least one second base being connected to the plurality of the first leads, the at least one second base being connected to the first base in a direction perpendicular to the plane of the first base;

a plurality of through silicon vias, each of the plurality of the through silicon vias penetrating through the second semiconductor chips in the first direction;

a plurality of third conductive bumps, each of the plurality of the third conductive bumps being located between two adjacent ones of the second semiconductor chips and correspondingly connected to the through silicon vias; and the second semiconductor chip stack structure is formed by hybrid bonding.

2. The semiconductor package structure according to claim 1, wherein, the first semiconductor chip comprises a logic chip, and the plurality of the second semiconductor chips comprises a DRAM chip.

3. The semiconductor package structure according to claim 1, wherein, the first semiconductor chip and the second semiconductor chip stack structure communicate by wireless.

4. The semiconductor package structure according to claim 1, wherein, a groove is provided in the first base, the first semiconductor chip is located in the groove, the first semiconductor chip is connected to the first base via first conductive bumps, and the at least one second base is connected to the first base via second conductive bumps.

5. The semiconductor package structure according to claim 1, wherein, the first semiconductor chip is located on the first base, the first semiconductor chip is connected to the first base via first conductive bumps, and the at least one second base is connected to the first base via second conductive bumps.

6. The semiconductor package structure according to claim 1, further comprising:

connectors located on a surface of the one of the second semiconductor chips located at the outermost of the second semiconductor chip stack structure in the first direction, and connecting the through silicon vias of the second semiconductor chip stack structure to the first leads.

7. The semiconductor package structure according to claim 1, wherein, the second semiconductor chip stack structure comprises at least one first chip stack structure and at least one second chip stack structure, the plurality of the first leads are provided at outermost one of the second semiconductor chips of the first chip stack structure and at outermost one of the second semiconductor chips of the second chip stack structure in the first direction respectively; the first chip stack structure and the second chip stack structure are arranged in parallel on the first semiconductor chip in the first direction, and are arranged with a surface of the first chip stack structure away from the first leads on the first chip stack structure facing a surface of the second chip stack structure away from the first leads on the second chip stack structure in the first direction; and the first chip stack structure is connected to one of the at least one second base and the second chip stack structure are connected to another of the at least one second base.

8. The semiconductor package structure according to claim 7, further comprising:

an adhesive film at least one of located between the first semiconductor chip and the second semiconductor chip stack structure, or located between the first chip stack structure and the second chip stack structure.

9. The semiconductor package structure according to claim 8, wherein, the adhesive film comprises a first adhesive film and a second adhesive film located on the first adhesive film, and an elastic modulus of the second adhesive film is greater than an elastic modulus of the first adhesive film.

10. The semiconductor package structure according to claim 1, wherein each of the signal lines comprises a ground line and a power line, and each of the plurality of the first leads includes a first sub-lead and a second sub-lead; and the ground line is electrically connected to the first sub-lead, and the power line is electrically connected to the second sub-lead.

11. The semiconductor package structure according to claim 10, wherein the first sub-lead is arranged between two adjacent ones of the second sub-leads.

12. The semiconductor package structure according to claim 1, further comprising:

a filling layer at least one of located between the second semiconductor chip stack structure and the at least one second base.

13. The semiconductor package structure according to claim 12, further comprising:

a package compound structure located on the first base, the package compound structure wrapping at least the second semiconductor chip stack structure and the at least one second base, a Young's modulus of the filling layer being greater than a Young's modulus of the package compound structure.

* * * * *